United States Patent
Ichikawa (10) Patent No.: US 7,336,137 B2
(45) Date of Patent: Feb. 26, 2008

(54) PLL FREQUENCY SETTING CIRCUIT

(75) Inventor: Takeshi Ichikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 133 days.

(21) Appl. No.: 11/377,552

(22) Filed: Mar. 17, 2006

(65) Prior Publication Data

US 2006/0262892 A1 Nov. 23, 2006

(30) Foreign Application Priority Data

May 17, 2005 (JP) ............................. 2005-143857

(51) Int. Cl.
*H03L 7/183* (2006.01)
(52) U.S. Cl. .................. 331/179; 331/177 R
(58) Field of Classification Search ............... 331/179, 331/177 R
See application file for complete search history.

(56) References Cited

U.S. PATENT DOCUMENTS

| 6,369,661 | B1 * | 4/2002 | Scott et al. ................. 331/45 |
| 7,084,710 | B2 * | 8/2006 | Huang et al. ............... 331/16 |
| 2003/0031267 | A1 * | 2/2003 | Hietala ....................... 375/295 |
| 2003/0142838 | A1 * | 7/2003 | Brennan et al. ............ 381/98 |

* cited by examiner

*Primary Examiner*—Joseph Chang
(74) *Attorney, Agent, or Firm*—Donald R. Studebaker; Nixon Peabody, LLP (57) ABSTRACT

A frequency setting circuit includes a table storing, in an address corresponding to a channel number, a quotient and a remainder calculated by subtracting 1 from the channel number to calculate a difference and dividing the difference by 3 are stored in bits b7 to b3 and bits b1 to b0, respectively. When the channel number is designated by a channel setting unit, a value of the bits b1 to b0 is decoded and given to a selector as a selection signal. A frequency set value of twelve bits of lower-order four digits is selected and output from the selector.

6 Claims, 5 Drawing Sheets

| CH | b7 | b6 | b5 | b4 | b3 | b2 | b1 | b0 |
|----|----|----|----|----|----|----|----|----|
| 1  | 0  | 0  | 0  | 0  | 0  |    | 0  | 0  |
| 2  | 0  | 0  | 0  | 0  | 0  |    | 0  | 1  |
| 3  | 0  | 0  | 0  | 0  | 0  |    | 1  | 0  |
| 4  | 0  | 0  | 0  | 0  | 1  |    | 0  | 0  |
| 5  | 0  | 0  | 0  | 0  | 1  |    | 0  | 1  |
| 6  | 0  | 0  | 0  | 0  | 1  |    | 1  | 0  |
| ⋮  | ⋮  | ⋮  | ⋮  | ⋮  | ⋮  |    | ⋮  | ⋮  |
| 66 | 1  | 0  | 1  | 0  | 1  |    | 1  | 0  |

| CHANNEL NUMBER | BASIC FREQUENCY A | | BASIC FREQUENCY B | |
|---|---|---|---|---|
| | TRANSMISSION SET VALUE | RECEPTION SET VALUE | TRANSMISSION SET VALUE | RECEPTION SET VALUE |
| 1 | 0x2d35228 | 0x2e46aac | 0x2c81abd | 0x2b4c556 |
| 2 | 0x2d35aac | 0x2e46dde | 0x2c82336 | 0x2b4c991 |
| 3 | 0x2d35dde | 0x2e47225 | 0x2c8288d | 0x2b4cccb |
| 4 | 0x2d36228 | 0x2e47aac | 0x2c82abd | 0x2b4d556 |
| 5 | 0x2d36aac | 0x2e47dde | 0x2c83336 | 0x2b4d991 |
| 6 | 0x2d36dde | 0x2e48226 | 0x2c8388d | 0x2b4dccb |
| ⋮ | ⋮ | ⋮ | ⋮ | ⋮ |
| 66 | 0x2d4bdde | 0x2e5c226 | 0x2c9888d | 0x2b62ccb |

| ADDRESS | b7 | b6 | b5 | b4 | b3 | b2 | b1 | b0 |
|---|---|---|---|---|---|---|---|---|
| 0 | 0 | 0 | 0 | 0 | 0 | 0 | 0 | 1 |
| 1 | 0 | 0 | 0 | 0 | 0 | 0 | 1 | 0 |
| 2 | 0 | 0 | 0 | 0 | 0 | 1 | 0 | 0 |
| 3 | 0 | 0 | 0 | 0 | 1 | 0 | 0 | 1 |
| 4 | 0 | 0 | 0 | 0 | 1 | 0 | 1 | 0 |
| 5 | 0 | 0 | 0 | 0 | 1 | 1 | 0 | 0 |
| 6 | 0 | 0 | 0 | 1 | 0 | 0 | 0 | 1 |
| 7 | 0 | 0 | 0 | 1 | 0 | 0 | 1 | 0 |
| ⋮ | ⋮ | ⋮ | ⋮ | ⋮ | ⋮ | ⋮ | ⋮ | ⋮ |
| 65 | 1 | 0 | 1 | 0 | 1 | 1 | 0 | 0 |
| 66 | 1 | 0 | 1 | 1 | 0 | 0 | 0 | 1 |
| 67 | 1 | 0 | 1 | 1 | 0 | 0 | 1 | 0 | ns
PLL FREQUENCY SETTING CIRCUIT

BACKGROUND OF THE INVENTION

1. Field of the Invention

The present invention relates to a Phase Lock Loop (PLL) frequency setting circuit used in a radio transceiver and the like.

2. Description of the Related Art

Figure 2:
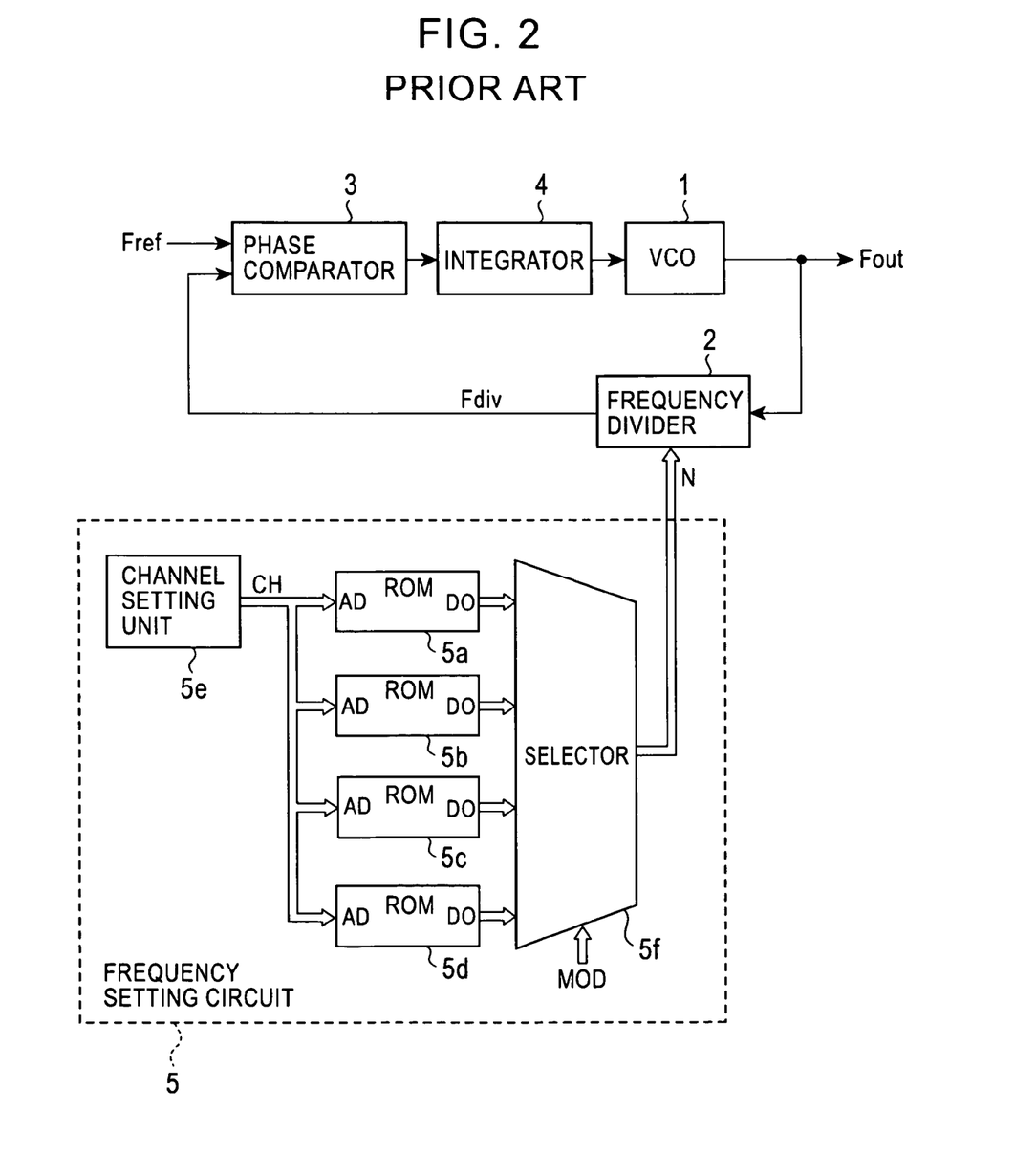
FIG. 2 is a schematic diagram of a conventional PLL circuit.

FIG. 2 is a schematic diagram of a conventional PLL circuit in a low-power radio transceiver.

The PLL circuit includes a Voltage Controlled Oscillator (VCO) 1 which generates a frequency Fout in a 400 MHz band, a frequency divider 2 which divides the frequency Fout and outputs a divided frequency Fdiv, a phase comparator 3 which compares phases of the divided frequency Fdiv and a reference frequency Fref and outputs a pulse of a width corresponding to a phase difference, an integrator 4 which integrates the pulse output from the phase comparator 3 and generates a control voltage for controlling the VCO 1, and a frequency setting circuit 5 for providing a frequency dividing value (i.e., a frequency set value) N to the frequency divider 2.

The frequency setting circuit 5 selects the frequency dividing value N for the frequency divider 2 on the basis of setting of basic frequencies A and B, switching of transmission and reception, and designation of a channel number and outputs the frequency dividing value N to the frequency divider 2. The frequency setting circuit 5 has four tables 5a, 5b, 5c, and 5d corresponding to combinations of a basic frequency and transmission and reception. The tables 5a to 5d are constituted by a memory such as a Read Only Memory (ROM). The tables 5a to 5d set a channel number CH as an address and store a frequency dividing value as data corresponding to the address. The channel number CH is given to address terminals AD of the tables 5a to 5d in common as an address signal from a channel setting unit 5e. Data output terminals DO of the tables 5a to 5d are connected to a selector 5f. A mode selection signal MOD designating a combination of the basic frequencies A and B and transmission and reception is provided to a control terminal of the selector 5f. The frequency dividing value N selected by the selector 5f based on the mode selection signal MOD is provided to the frequency divider 2.

Figure 3:
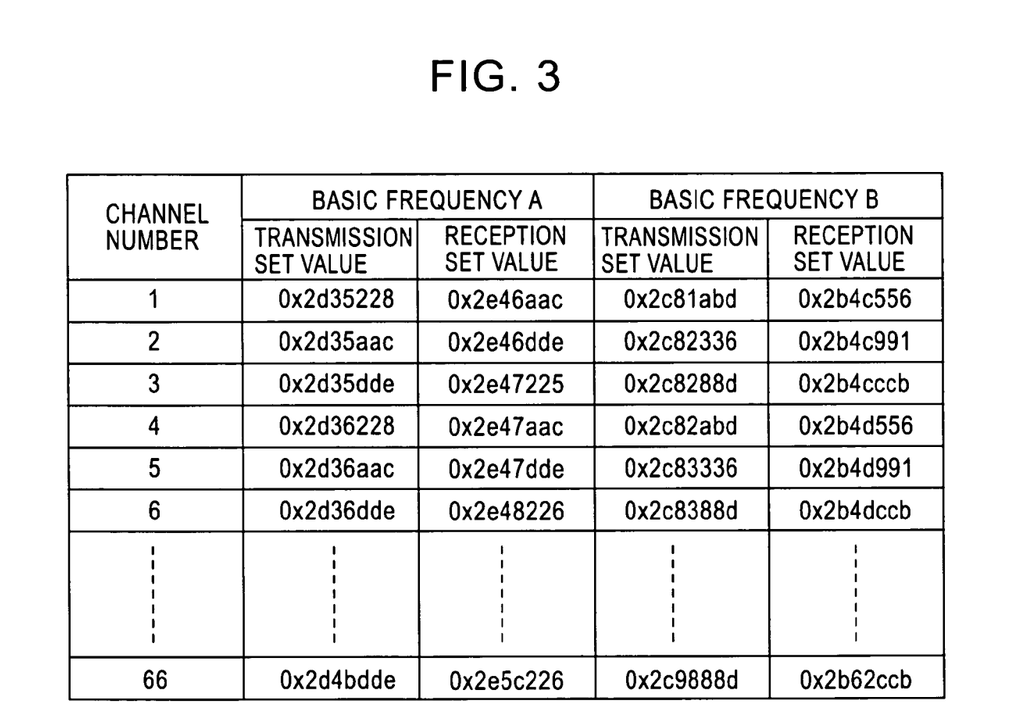
FIG. 3 is a diagram showing an example of tables 5a to 5d in FIG. 2.

FIG. 3 is a diagram showing an example of the tables 5a to 5d in FIG. 2.

For example, the table 5a is selected according to the mode selection signal MOD when the basic frequency A is set to perform transmission. When a channel number 1 is designated, a first address of the table 5a is read out and a 28-bit signal of 0x2d35228 ("0x" means that the following alphanumeric character is a hexadecimal number) is output as a frequency set value N.

However, the frequency setting circuit 5 in the PLL circuit needs a table for each combination of the basic frequencies A and B and transmission and reception. The respective data of the table has a 28-bit configuration. Thus, a large capacity memory is required.

SUMMARY OF THE INVENTION

The invention has been devised with regard paid to regularity of a channel number and a frequency set value. It is an object of the invention to reduce the size of a PLL frequency setting circuit.

When a channel number and a frequency set value have a relation in which a frequency set value of k+m+n bits set in the PLL increases in accordance with an increase in a channel number, and when a value of lower-order n bits of the frequency set value returns to an initial value and a value of intermediate m bits thereof increases by one every time the channel number increases by x (x is an integer equal to or larger than 2), the PLL frequency setting circuit of the invention includes tables described below, an adding unit, and a selecting unit.

The table is a memory in which a quotient and a remainder calculated by dividing a number, which is calculated by adding the channel number to an integer "a," defined based on the relation between the channel number and the frequency set value, by x are set as y and z, respectively, the channel number is set as an address, and y and z are as stored data of the address.

The adding unit adds up the data y read out from the table when the channel number is given as an address signal and an initial value of the intermediate m bits of the frequency set value and outputs an added value as a signal of the intermediate m bits of the frequency set value. The selecting unit selects, in accordance with the data z read out from the table when the channel number is given as an address signal and, a corresponding value out of the x types of values defined in advance as a value of the lower-order n bits of the frequency set value and outputs the value as a signal of the lower-order n bits of the frequency set value.

In the present invention, rather than holding all digits of a frequency set value corresponding to a channel number, paying attention to regularity of correspondence between the channel number and the frequency set value, lower-order digits periodically switched in an identical pattern are selected by the selecting unit and intermediate digits increasing by one at a fixed period are formed by the adding unit. Consequently, there is an advantage that it is possible to reduce the size of the frequency setting circuit since the volume of the table is reduced.

DETAILED DESCRIPTION OF THE INVENTION

A frequency setting circuit includes a table, an address generating unit, a plurality of frequency setting units, and a selecting unit. The table is constituted by a memory in which a quotient and a remainder calculated by dividing a value of an address by x are set as y and z, respectively, when there is a plurality of frequency set value modes according to combinations of basic frequencies and transmission and reception. The value of y is stored as storage data of the address, and decode information obtained by decoding a value of z is stored. The address generating unit corrects a designated channel number to generate an address for table search on the basis of a first selection signal for selecting a basic frequency and a second selection signal for selecting transmission or reception. The frequency setting unit includes an adder that is provided for each combination of the first and the second selection signals and adds up the data y read out from the table and an initial value of intermediate m bits of the frequency set value and outputs an added value as a signal of the intermediate m bits of the frequency set value. A selector is included that selects a corresponding value out of x types of values defined in advance as a value of lower-order n bits of the frequency set value, on the basis of decode information read out from the table, and outputs the value as a signal of the lower-order n bits of the frequency set value. The selecting unit selects, on the basis of the first and the second selection signals, a corresponding frequency set value out of frequency set values output from the plurality of frequency setting units, respectively. Consequently, it is possible to further reduce the size of the frequency setting circuit compared with the case in which a table is prepared for each mode.

The above and other objects and new features of the present invention will be better understood by reading the following detailed description of presently preferred embodiments of the invention, when considered in connection with the accompanying drawings. However, the drawings are solely for explanation of the invention and do not limit a scope of the invention.

FIRST EMBODIMENT

The present invention has been made with regard to regularity of a channel number and a frequency set value. For example, in FIG. 3, referring to a transmission set value of a basic frequency A, when a channel number increases by one at a time from 1 to 2 and 3, the lower-order three digits (one digit consists of four bits) increase from 0x228 to 0xaac and 0xdde. When the channel number changes to 4, the value of the lower-order three digits of the transmission set value returns to 0x228 and a value of the higher-order four digits thereof increases by one. In other words, in the lower-order three digits of the transmission set value, a pattern of three kinds of values 0x228, 0xaac, and 0xdde is periodically repeated. The higher-order four digits (sixteen bits) increase by one every time the lower-order three digits return to 0x228. However, the most significant two digits take a fixed value of 0x2d, since carry-over does not occur in the most significant two digits among the higher-order four digits.

Therefore, when a quotient and a remainder calculated by subtracting 1 from the channel number to calculate a difference and dividing the difference by 3 are set as y and z, respectively, the intermediate two digits are 0x35+y and the lower-order three digits of the transmission set value are 0x228, 0xaac, and 0xdde when a value of z is 0, 1, and 2, respectively. The higher-order two-digits of the transmission set value are the fixed value of 0x2d.

In FIG. 3, referring to a reception set value of the basic frequency A, when the channel number increases from 1 to 2, the lower-order three digits (twelve bits) increase from 0xaac to 0xdde. When the channel number changes to 3, the lower-order three digits of the reception set value are 0x226 and the higher-order four digits increase by one. Moreover, when the channel number increases from 4 to 5, the lower-order three digits of the reception set value increase from 0xaac to 0xdde. When the channel number changes to 6, the lower-order three digits of the reception set value returns to 0x226 and the higher-order four digits increase by 1.

Therefore, in this case, when a quotient and a remainder calculated by dividing the channel number by 3 are y and z, respectively, the higher-order two digits of the reception set value take a fixed value of 0x2e and the intermediate two digits thereof are 0x46+y. The lower-order three digits of the reception set value are 0x226, 0xaac, and 0xdde when a value of z is 0, 1, and 2, respectively.

The present invention sets frequencies setting for the PLL with a simple circuit configuration based on regularity of a channel number and a frequency set value.

Figure 1A:
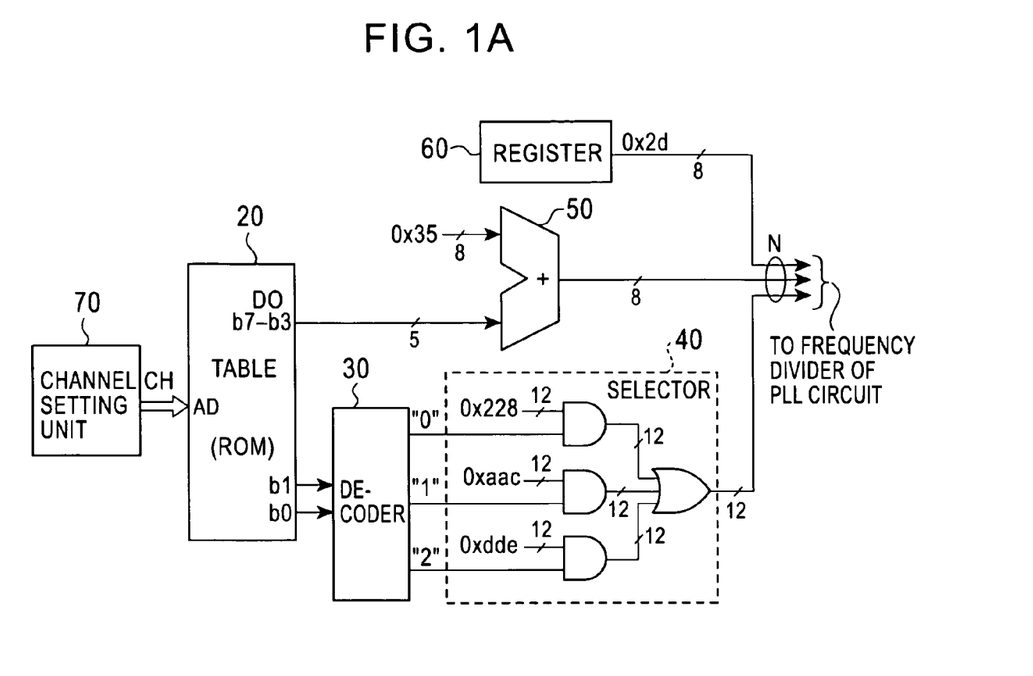
FIG. 1A is a diagram of a PLL frequency setting circuit according to a first embodiment of the invention.

FIG. 1A is a diagram of a PLL frequency setting circuit according to a first embodiment of the invention.

The PLL frequency setting circuit outputs a frequency set value N for transmission at the basic frequency A in FIG. 3. The PLL frequency setting circuit includes a channel setting unit 10, a table 20, a decoder 30, a selector 40, an adder 50, and a register 60.

Figure 1B:
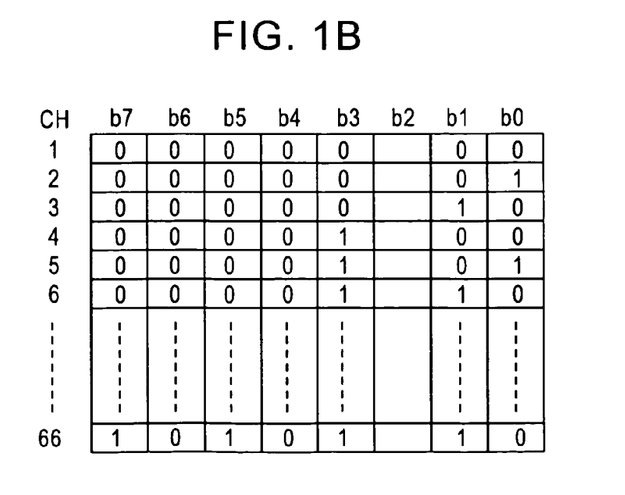
FIG. 1B is a diagram showing a part of content stored in a table 20 (ROM) in FIG. 1A.

The table 20 is constituted by a Read Only Memory (ROM). A channel number CH is given to an address terminal AD of the table 20 from the channel setting unit 10. In an address corresponding to the channel number CH in the ROM, a quotient and a remainder calculated by subtracting 1 from the channel number CH to calculate a difference and dividing the difference by 3 are stored in bits b7 to b3 and bits b1 to b0, respectively. The decoder 30 decodes a value of the bits b1 to b0 output from the ROM of the table 20 and sets an output signal of any one of "0", "1", and "2" as "H".

The selector 40 is a combination of logic gates such as AND and OR gates. The selector 40 selects any one of the values of 0x228, 0xaac, and 0xdde according to an output signal of the decoder 30 and outputs the value. In other words, if the output signal "0" of the decoder 30 is "H", 0x228 is selected, if the output signal "1" is "H", 0xaac is selected, and if the output signal "2" is "H", 0xdde is selected. The value selected by the selector 40 is output as a signal of lower-order twelve bits of the frequency set value N.

The adder 50 is an eight-bit adder that adds up a value of bits b7 to b3 output from the ROM of the table 20 and a fixed value 0x35. An addition result output from the adder 50 is output as a signal of intermediate eight bits of the frequency set value N.

The register 60 outputs a value 0x2d of higher-order eight bits of the frequency set value N as a signal of higher-order eight bits of the frequency set value N regardless of the channel number CH. The signals of twenty-eight bits in total output from the selector 40, the adder 50, and the register 60 are transmitted to the frequency divider 2 in the PLL circuit in FIG. 2 as the frequency set value N.

Operations of the PLL frequency setting circuits will now be described.

When the channel number CH for transmission is designated by the channel setting unit 10, the channel number CH is transmitted to the table 20. Consequently, data of an address corresponding to the channel number CH in the ROM constituting the table 20 is read out. The value of the bits b1 to b0 in the data read out is given to the decoder 30 and decoded as a selection signal for the selector 40. The selector 40 outputs a signal of the lower-order twelve bits of the frequency set value N on the basis of the selection signal.

On the other hand, the value of the bits b7 to b3 read out from the table 20 is sent to the adder 50 and added to the fixed value 0x35. A value of eight bits obtained as a result of the addition is output as a signal of the intermediate eight bits of the frequency set value N.

The signal of twelve bits output from the selector 40 and the signal of eight bits output from the adder 50 are combined with the signal of eight bits set in the register 60. Consequently, the frequency set value N of twenty-eight bits in total is generated.

As described above, the PLL frequency setting circuit in the first embodiment is constituted by combining the selector 40 and the adder 50 to utilize the regularity of the lower-order twelve bits of the frequency set value N that cyclically use the three different values and the higher-order sixteen bits is incremented by one at every cycle. Consequently, since a large ROM is not required for the table 20, it is possible to reduce the size of the PLL frequency setting circuit.

The present invention is not limited to the first embodiment. Various modifications of the invention are possible. Examples of the modifications areas described below.

(1) In the first embodiment, the table 20 uses the quotient y and the remainder z that are results calculated by dividing a number, which is calculated by subtracting 1 from the channel number CH, by 3. However, a result calculated by dividing a number, which is calculated by adding 2 to the channel number, by 3 may be used. In that case, since a value of y increases by one, a fixed value added by the adder 50 only has to be reduced by one to 0x34.

(2) In the first embodiment, the frequency set value N for transmission at the basic frequency A in FIG. 3 is explained. However, when the invention is applied to a frequency set value for reception at the basic frequency A, what has to be done is only to store the quotient y and the remainder z calculated by dividing the channel number CH by 3 in an address corresponding to the channel number CH in the table 20, constitute the selector 40 to select values of 0x226, 0xaac, and 0xdde according to the output signals "0", "1", and "2" of the decoder 30, respectively, and output the values, constitute the adder 50 to add up a value of bits b7 to b3 output from the table 20 and a fixed value 0x46, and set 0x2e in the register 60 as a fixed value.

(3) For example, when the four modes are switched and actuated as shown in FIG. 2, what has to be done is only to provide PLL frequency setting circuits for transmission and reception for each of the basic frequencies A and B, provide the channel number CH to the PLL frequency setting circuits in common, and select the frequency set values N output from the PLL frequency setting circuits according to a mode selection signal and provide the frequency set values N to a frequency divider of a PLL circuit. Moreover, it is also possible to provide PLL frequency setting circuits for a large number of basic frequencies C, D, and the like.

(4) In the first embodiment, the remainder z calculated by dividing the channel number by 3 is stored in the bits b1 to b0 of the table 20, the read-out bits b1 to b0 are decoded by the decoder 30, and three selection signals are given to the selector 40. However, if three decoded selection signals are stored in the bits b2 to b0 of the table 20 in advance, the decoder 30 is unnecessary.

(5) In the explanation of the first embodiment, the lower-order twelve bits of the frequency set value N cyclically use three different values. However, when a channel number and the frequency set value N have a relation in which, when the channel number increases, the frequency set value N of k+m+n bits set in a PLL in association with the channel number also increases, a value of lower-order n bits of the frequency set value N returns to an initial value and a value of intermediate m bits increases by one every time the channel number increases by x (x is an integer equal to or larger than 2), it is possible to constitute the same frequency setting circuit by applying the first embodiment explained with reference to FIG. 1A.

In that case, a ROM in which a quotient and a remainder calculated by dividing a number, which is calculated by adding the channel number CH to an integer "a" defined on the basis of the relation between the channel number CH and the frequency set value N, by x are set as y and z, respectively. The channel number CH is set as an address, and y and z (or data obtained by decoding z) are stored as data corresponding to the address is used as the table 20.

The selector 40 is constituted so as to select a corresponding value out of x kinds of values defined in advance as a value of the lower-order n bits of the frequency set value N in accordance with the data z read out from the table 20 and output the value as a signal of the lower-order n bits of the frequency set value N.

Moreover, the adding unit 50 adds up the data y read out from the table 20 and an initial value of the intermediate m bits of the frequency set value N and outputs a signal of the intermediate m bits of the frequency set value N.

(6) Since an input side of a frequency divider of a PLL circuit only has to be fixedly connected to "L" or "H", it is unnecessary to output the part of a higher-order fixed value of the frequency set value N from the register 60 of the PLL frequency setting circuit.

SECOND EMBODIMENT

Figure 4:
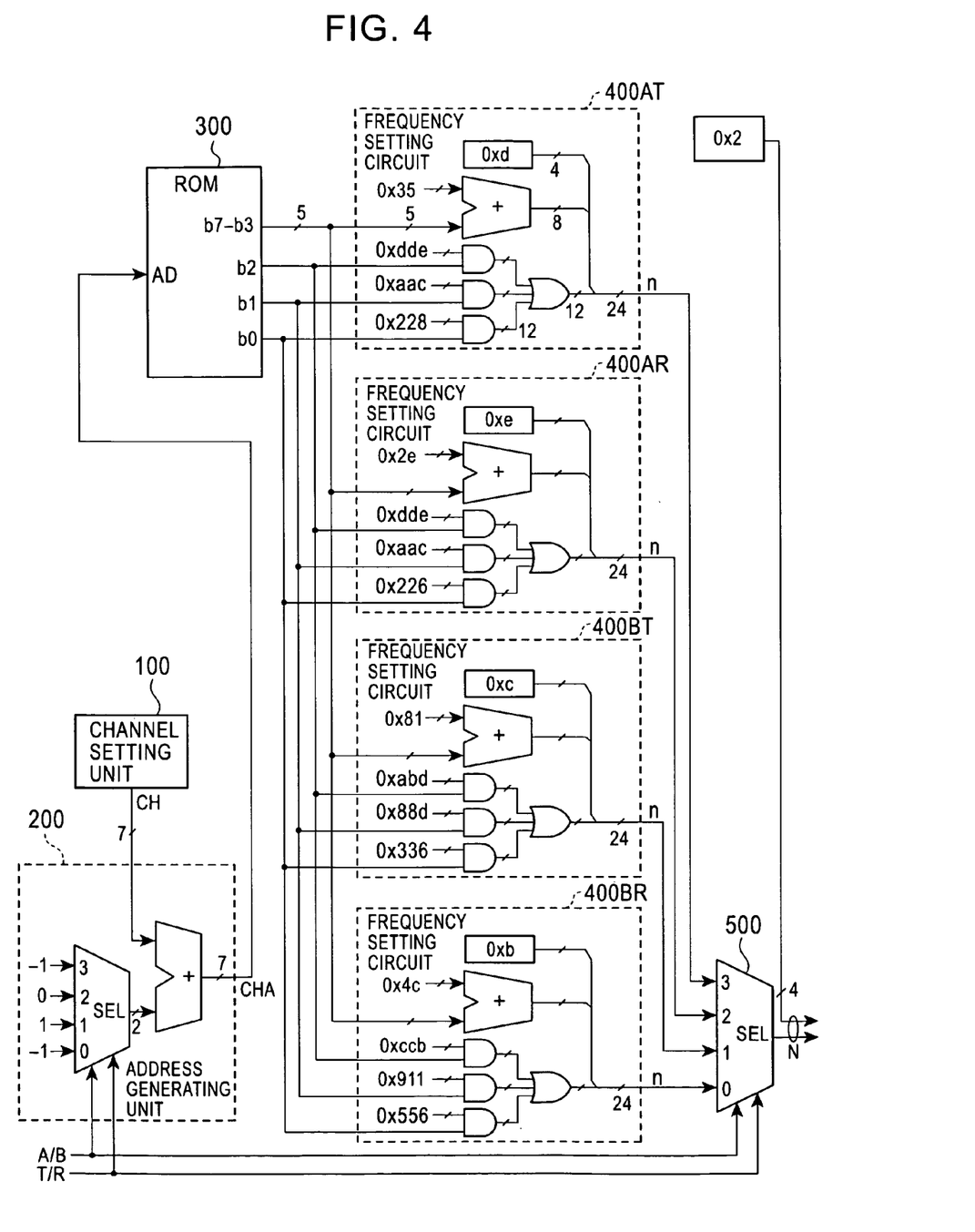
FIG. 4 is a diagram of a PLL frequency setting circuit according to a second embodiment of the invention.

FIG. 4 is a diagram of a PLL frequency setting circuit according to a second embodiment of the invention.

The PLL frequency setting circuit generates transmission set values and reception set values of the basic frequencies A and B in FIG. 3, selects a transmission set value and a reception set value according to selection signals A/B and T/R for mode selection, and outputs the transmission set value and the reception set value as the frequency set value N. The selection signal A/B is a signal for selecting a basic frequency. Specifically, the basic frequency A is selected when an output signal is "H". The basic frequency B is selected when an output signal is "L". The selection signal T/R is a signal for selecting transmission and reception. Specifically, transmission is selected when an output signal is "H", and reception is selected when an output signal is "L".

The PLL frequency setting circuit includes a channel setting unit 100, an address generating unit 200, a ROM 300, frequency setting units 400AT, 400AR, 400BT, and 400 BR, and a selector 500.

The channel setting unit 100 sets the channel number CH for transmission and reception.

The address generating unit 200 generates an address CHA for table search on the basis of the set channel number CH and the selection signals A/B and T/R. The address generating unit 200 includes a selector 201 which selects any one of −1, 0, and +1 in accordance with the selection signals A/B and T/R and an adder 202 which adds up an output of the selector 201 and the channel number CH and outputs the address CHA. In the address generating unit 200, −1 is added to the channel number CH in the case of transmission at the basic frequency A, 0 is added to the channel number CH in the case of reception at the basic frequency A, 1 is added to the channel number CH in the case of transmission at the basic frequency B, and −1 is added to the channel number CH in the case of reception at the basic frequency B.

The ROM 300 is a memory which stores data for frequency setting corresponding to the address CHA given from the address generating unit 200 as a table.

Figure 5:
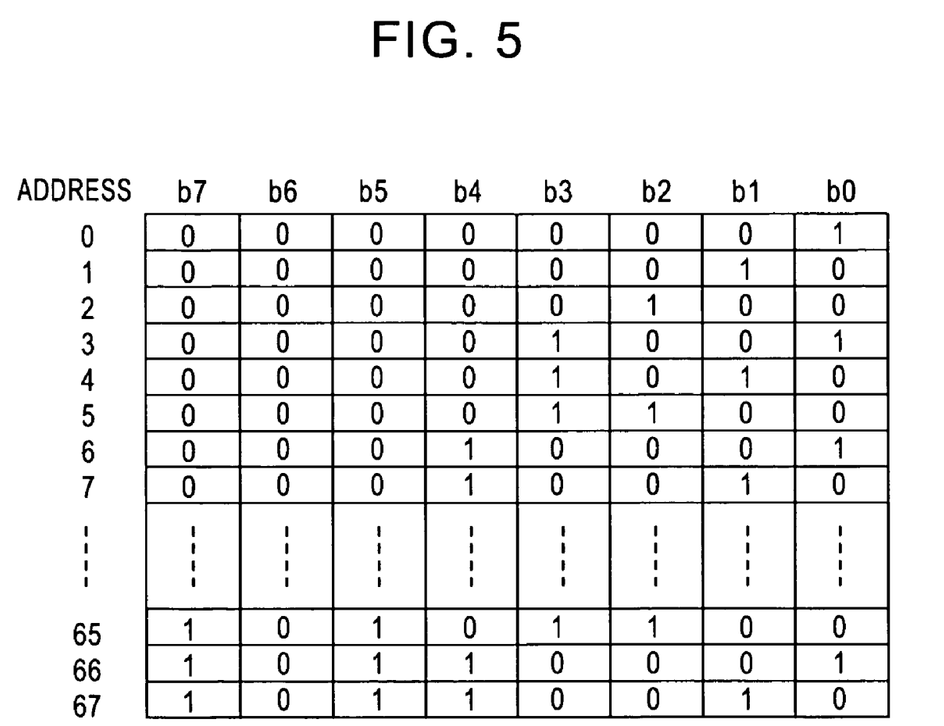
FIG. 5 is a diagram showing a part of content stored in a ROM 300 in FIG. 4.

FIG. 5 is a diagram showing a part of the content stored in the ROM 300 in FIG. 4. As shown in FIG. 5, the ROM 300 is a memory consisting of 8 bits×68 words in which each address stores eight bits. A quotient calculated by dividing a value of the address by 3 is stored in bits b7 to b3 of the address. Data of a result of decoding a remainder calculated by dividing a value of the address by 3 is stored in bits b2 to b0 of the address. In other words, the bit b0 is set to "1" when the remainder is 0, the bit b1 is set to "1" when the remainder is 1, and the bit b2 is set to "1" when the remainder is 2.

The frequency setting units 400AT to 400BR generate frequency set values n, respectively, on the basis of data for frequency setting of eight bits received from the ROM 300 in common. The frequency setting units 400AT to 400BR correspond to the selector 40, the adder 50, and the register 60 in FIG. 1A. However, a value of twelve bits of the lower-order four digits selected by the selector 40, a value of eight bits of the intermediate two digits added by the adder 50, and a value of four bits of the higher-order digits received from the register 60 are different from one another. In other words, the frequency setting unit 400AT outputs the frequency set value n of twenty-four bits for transmission at the basic frequency A, the frequency setting unit 400AR outputs the frequency set value n for reception at the basic frequency A, the frequency setting unit 400BT outputs the frequency set value n for transmission at the basic frequency B, and the frequency setting unit 400BR outputs the frequency set value n for reception at the basic frequency B.

The selector 500 selects output signals of the frequency setting units 400AT to 400BR on the basis of the selection signals A/B and T/R for mode selection that are the same as those used by the address generating unit 200. In other words, the frequency setting unit 400AT is selected in the case of transmission at the basic frequency A, the frequency setting unit 400AR is selected in the case of reception at the basic frequency A, the frequency setting unit 400BT is selected in the case of transmission at the basic frequency B, and the frequency setting unit 400BR is selected in the case of reception at the basic frequency B.

The frequency set value n of twenty-four bits selected by the selector 500 is combined with four bits of a fixed value 0x2 of the most significant digits and provided to a frequency divider of a PLL circuit as the frequency set value N of twenty-eight bits in total.

Operations of the PLL frequency setting circuit will be described.

For example, it is assumed that the channel CH is set to 4 at the time of transmission at the basic frequency B (i.e., when the selection signal A/B is "L" and the selection signal T/R is "H").

The selector 201 of the address generating unit 200 selects 1 and the adder 202 adds up this value and the channel number CH. Thus, the address CHA provided to the ROM 300 is 5. Consequently, bits b7 to b3 read out from the ROM 300 are "00001", a bit b2 is "1", and bits b1 and b0 are "0". These values are provided to the frequency setting units 400AT to 400BR in common. The frequency setting units 400AT to 400BR output the frequency set values n, respectively.

On the other hand, the selector 500 selects the frequency set value n of the frequency setting unit 400BT according to the selection signals A/B and T/R. Therefore, a value of the frequency set value n output from the selector 500 is 0xc82abd. Since the value 0x2 of the most significant four bits is added to the value, the frequency set value N given to the PLL circuit is 0x2c82abd.

As described above, the PLL frequency setting circuit in the second embodiment includes the address generating unit 200 that corrects the set channel number CH and generates the address CHA for table search in accordance with the selection signal A/B for selecting the basic frequency A or B and the selection signal T/R for selecting transmission or reception. This makes it unnecessary to prepare an individual table for each combination of basic frequencies and transmission and reception. Compared with the PLL frequency setting circuit explained in the modification (3) of the first embodiment, it is possible to further reduce a table area and further reduce the size of the PLL frequency setting circuit.

It is also possible to apply the extension as described in the modification (5) of the first embodiment to the second embodiment.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2005-143857 which is hereby incorporated by reference.

What is claimed is:

1. A PLL frequency setting circuit in which a channel number and a frequency set value has a relation such that the frequency set value of k+m+n bits set in a PLL circuit increases in accordance with an increase in a channel number and, every time the channel number increases by x (x is an integer equal to or larger than 2), a value of lower-order n bits of the frequency set value returns to an initial value and a value of intermediate m bits thereof increases by one, the PLL frequency setting circuit comprising:
    a table constituted by a memory in which a quotient and a remainder calculated by dividing a number, which is calculated by adding the channel number to an integer "a" defined based on the relation between the channel number and the frequency set value, by x are set as y and z, respectively, the channel number is set as an address, and y and z are stored as data of the address;
    an adding unit that adds the data y read out from the table when the channel number is given as an address signal and an initial value of the intermediate m bits of the frequency set value and outputs an added value as a signal of the intermediate m bits of the frequency set value; and
    a selecting unit that selects a corresponding value out of the x kinds of values defined in advance as a value of the lower-order n bits of the frequency set value in accordance with the data z read out from the table when the channel number is given as an address signal and outputs the value as a signal of the lower-order n bits of the frequency set value.

2. A PLL frequency setting circuit according to claim 1, wherein the PLL circuit includes a frequency divider to perform frequency control on the basis of an output of the frequency divider, and the frequency set value corresponds to a frequency division ratio of the frequency divider.

3. A PLL frequency setting circuit according to claim 1, further comprising a register which stores and outputs a fixed value, the fixed value being defined in advance as a value of the higher-order "k" bits of the frequency set value.

4. A PLL frequency setting circuit in which a channel number and a frequency set value has a relation such that the frequency set value of k+m+n bits set in a PLL circuit increases in accordance with an increase in a channel number and, every time the channel number increases by x (x is an integer equal to or larger than 2), a value of lower-order n bits of the frequency set value returns to an initial value and a value of intermediate m bits thereof increases by one, the PLL frequency setting circuit comprising:

- a table constituted by a memory in which a quotient and a remainder calculated by dividing a value of an address by x are set as y and z, respectively, a value of y is stored as storage data of the address, and decode information obtained by decoding a value of z is stored;
- an address generating unit which corrects a designated channel number and generates an address for table search on the basis of a first selection signal for selecting a basic frequency and a second selection signal for selecting transmission or reception;
- a plurality of frequency setting units including an adder which is provided for each combination of the first and the second selection signals and adds the data y read out from the table and an initial value of intermediate m bits of the frequency set value and outputs an added value as a signal of the intermediate m bits of the frequency set value and a selector that selects a corresponding value out of x kinds of values defined in advance as a value of lower-order n bits of the frequency set value on the basis of decode information read out from the table and outputs the value as a signal of the lower-order n bits of the frequency set value; and
- a selecting unit which selects a corresponding frequency set value out of frequency set values output from the plurality of frequency setting units, respectively, on the basis of the first and the second selection signals.

5. A PLL frequency setting circuit according to claim 4, wherein the PLL circuit includes a frequency divider to perform frequency control on the basis of an output of the frequency divider, and the frequency set value corresponds to a frequency division ratio of the frequency divider.

6. A PLL frequency setting circuit according to claim 4, further comprising registers provided correspondingly to each combination of the first and the second selection signals, wherein each of the registers stores and outputs a fixed value defined in advance as a value of the higher-order "k" bits of the corresponding frequency set value.

* * * * *